United States Patent
Schumacher et al.

(10) Patent No.: US 10,380,313 B1
(45) Date of Patent: Aug. 13, 2019

(54) IMPLEMENTATION AND EVALUATION OF DESIGNS FOR HETEROGENEOUS COMPUTING PLATFORMS WITH HARDWARE ACCELERATION

(71) Applicant: Xilinx, Inc., San Jose, CA (US)

(72) Inventors: Paul R. Schumacher, Berthoud, CO (US); Kumar Deepak, San Jose, CA (US); Scott Jonas, Niwot, CO (US)

(73) Assignee: XILINX, INC., San Jose, CA (US)

( * ) Notice: Subject to any disclaimer, the term of this patent is extended or adjusted under 35 U.S.C. 154(b) by 294 days.

(21) Appl. No.: 15/372,731

(22) Filed: Dec. 8, 2016

(51) Int. Cl.
G06F 17/50 (2006.01)

(52) U.S. Cl.
CPC ............................... G06F 17/5081 (2013.01)

(58) Field of Classification Search
CPC .................... G06F 17/5009; G06F 17/5081
USPC .................................................. 717/124–135
See application file for complete search history.

(56) References Cited

U.S. PATENT DOCUMENTS

| | | | | |
|---|---|---|---|---|
| 6,263,489 B1 * | 7/2001 | Olsen | ................. | G06F 11/3628 714/E11.209 |
| 7,805,593 B1 * | 9/2010 | Donlin | ................. | G06F 11/3466 712/227 |
| 7,953,912 B2 * | 5/2011 | Krishnamurthy | ..... | G06F 9/5061 345/502 |
| 8,141,066 B2 * | 3/2012 | Chatterjee | ............... | G06F 8/443 717/130 |
| 8,214,701 B1 * | 7/2012 | Malhotra | ............ | G06F 11/3656 714/725 |
| 8,327,200 B1 * | 12/2012 | Mohan | ............................ | 714/25 |
| 8,402,442 B1 * | 3/2013 | Chan | .................... | G06F 11/3664 714/25 |
| 8,595,555 B1 * | 11/2013 | Taylor | ................. | G06F 11/3648 714/30 |
| 8,762,916 B1 * | 6/2014 | Kathail | ............... | G06F 17/5054 326/37 |
| 8,768,678 B1 * | 7/2014 | Mihalache | ............ | G06F 9/4881 703/13 |
| 9,058,135 B1 * | 6/2015 | Schumacher | .............. | G06F 1/12 |
| 9,081,925 B1 * | 7/2015 | Schumacher | ....... | G06F 17/5022 |
| 9,529,946 B1 * | 12/2016 | Schumacher | ....... | G06F 17/5022 |
| 9,846,587 B1 * | 12/2017 | Schumacher | ........... | G06F 9/455 |
| 9,977,758 B1 * | 5/2018 | Schumacher | ....... | G06F 13/4221 |
| 2005/0066305 A1 * | 3/2005 | Lisanke | .............. | G06F 17/5022 717/104 |

(Continued)

OTHER PUBLICATIONS

U.S. Appl. No. 14/887,080, filed Oct. 19, 2015, Schumacher, Paul R., San Jose, CA USA.

*Primary Examiner* — Marina Lee
(74) *Attorney, Agent, or Firm* — Kevin T. Cuenot

(57) ABSTRACT

Implementing a design for a heterogeneous computing platform can include storing, using a processor, profile data in a memory, wherein the profile data is generated from running the design for the heterogeneous computing platform and wherein the design includes a kernel adapted for hardware acceleration. Compliance of the design with a profile rule may be determined by comparing, using the processor, the profile data accessed from the memory with the profile rule. The profile rule can specify a design requirement for a hardware accelerated implementation of the kernel. Compliance of the design with the profile rule can be indicated, using the processor, based upon the comparing.

20 Claims, 5 Drawing Sheets

(56) References Cited

U.S. PATENT DOCUMENTS

| | | | |
|---|---|---|---|
| 2008/0172661 A1* | 7/2008 | Chatterjee | G06F 8/443 |
| | | | 717/158 |
| 2011/0296364 A1* | 12/2011 | Chen | G06F 17/5068 |
| | | | 716/122 |
| 2012/0084742 A1* | 4/2012 | Ispir | G06F 17/5045 |
| | | | 716/101 |
| 2013/0031013 A1* | 1/2013 | V | G06Q 10/02 |
| | | | 705/319 |
| 2013/0212365 A1* | 8/2013 | Chen | G06F 17/5054 |
| | | | 713/1 |

\* cited by examiner

| Kernel Data Transfer | Threshold Value | Actual Value | Conclusion | Details | Guidance Option |
|---|---|---|---|---|---|
| Read Size (KB) | 512 | 0.0064 | Not Met | Kernel read size of 0.064 KB on PCIE port A is low | Consider using burst read transfer |
| Write Size (KB) | 512 | 0.0064 | Not Met | Kernel write size of 0.064 KB on PCIE port A is low | Consider using burst write transfer |
| Read Bandwidth (%) | 10 | 6.114 | Not Met | Kernel read utilization of 6.114% on PCIE is low | Improve kernel data path or memory read efficiency |
| Write Bandwidth (%) | 10 | 0.042 | Not Met | Kernel write utilization of 0.042% on PCIE is low | Improve kernel data path or memory write efficiency |
| Read Amount – Max (MB) | 2 | 143.906 | Not Met | Total kernel read of 150.897 MB on PCIE port | Re-use data with local or private memories |
| Read Amount – Min (MB) | 0.250 | 140.906 | Met | Compute units on all devices use adequate data from host | |

| Host Data Transfer | Threshold Value | Actual Value | Conclusion | Details | Guidance Option |
|---|---|---|---|---|---|
| Read Size (KB) | 4.096 | 1048.58 | Met | Host read transfers are efficient from off-chip global memory | - |
| Write Size (KB) | 4.096 | 2.048 | Not Met | Host write average size of 2.048 is low | Improve efficiency by consolidating write transfers |

| Resource Usage | Threshold Value | Actual Value | Conclusion | Details |
|---|---|---|---|---|
| Compute Unit Calls - Min | >0 | 1 | Met | All available compute units were used |
| Compute Unit Calls - Max | <1000 | 1 | Met | All compute units were used an adequate amount |
| Compute Unit Utilization (%) | 10.000 | 99.978 | Met | All compute units have sufficient utilization |
| Kernel Utilization (%) | 100.00 | 100.000 | Met | All kernels utilize correct amount of work groups |
| Device Utilization (msec) | >0 | 385.534 | Met | All available devices were used |

Improve kernel data path or memory read efficiency

There are a number of ways to improve this utilization by increasing the efficiency of the transfers and/or the data paths of the kernels. Possible options include: vectorization, loop unrolling, pipelining, and maximizing port widths.

Not Recommended:
```
void vadd( _global int* a, _global int* b, _global int* C) {
   for (int i=0; i<256; i++) {
      c[i] = a[i] + b[i];
   }
}
```

Recommended:
```
void vadd( _global int16* a, _global int16* b, _global int16* C) {
   for (int i=0; i<256/16; i++) {
      c[i] = a[i] + b[i];
   }
}
```

IMPLEMENTATION AND EVALUATION OF DESIGNS FOR HETEROGENEOUS COMPUTING PLATFORMS WITH HARDWARE ACCELERATION

RESERVATION OF RIGHTS IN COPYRIGHTED MATERIAL

A portion of the disclosure of this patent document contains material which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

FIELD OF THE INVENTION

This disclosure relates to heterogeneous computing platforms and, more particularly, to implementation and evaluation of designs for heterogeneous computing platforms with hardware acceleration.

BACKGROUND

Some modern computer programs are adapted to execute on heterogeneous computing platforms that include a host processor and one or more other devices. These computer programs typically include a host portion that is compiled into executable program code to execute on the host processor and one or more other portions, called kernels. The kernels are compiled into executable program code and are designated to execute on devices other than the host processor. Examples of these other devices include, but are not limited to, graphics processing unit(s) (GPUs), digital signal processor(s) (DSPs), and so forth.

In some cases, the kernels are hardware accelerated. Accordingly, the kernels are compiled into circuitry that is implemented within an IC. A kernel circuit, referring to a circuit implementation of a kernel, is functionally equivalent to an executable version of the kernel. A circuit design specifying the kernel circuit, for example, may be loaded into a programmable IC thereby implementing the kernel as a kernel circuit in hardware.

The kernel portion of the design is typically coded using a high level programming language (HLL). As such, kernel developers are often software developers or have software development backgrounds. For these reasons, kernel developers usually lack the hardware design knowledge necessary to debug, improve, and/or optimize kernel circuitry generated from the HLL kernel descriptions in order to meet established design requirements.

SUMMARY

One or more embodiments are directed to methods of implementing a design for a heterogeneous computing (HC) platform. In one aspect, a method can include storing, using a processor, profile data in a memory, wherein the profile data is generated from running the design for the HC platform and wherein the design includes a kernel adapted for hardware acceleration. The method can include determining compliance of the design with a profile rule by comparing, using the processor, the profile data accessed from the memory with the profile rule. The profile rule specifies a design requirement for a hardware accelerated implementation of the kernel. The method can include indicating, using the processor, compliance of the design with the profile rule based upon the comparing.

One or more embodiments are directed to systems for implementing a design for an HC platform. In one aspect, a system can include a memory adapted to store profile data generated from running the design for the HC platform, wherein the design includes a kernel adapted for hardware acceleration. The system can include a processor coupled to the memory and adapted to determine compliance of the design with a profile rule by comparing the profile data accessed from the memory with the profile rule. The profile rule can specify a design requirement for a hardware accelerated implementation of the kernel. The processor may be further adapted to indicate compliance of the design with the profile rule based upon the comparing.

One or more embodiments are directed to computer program products for implementing a design for an HC platform. In one aspect, a computer program product includes a computer readable storage medium having program code stored thereon. The program code is executable by a processor to perform a method. The method can include storing, using a processor, profile data in a memory, wherein the profile data is generated from running the design for the heterogeneous computing platform and wherein the design includes a kernel adapted for hardware acceleration. The method can include determining compliance of the design with a profile rule by comparing, using the processor, the profile data accessed from the memory with the profile rule. The profile rule specifies a design requirement for a hardware accelerated implementation of the kernel. The method can include indicating, using the processor, compliance of the design with the profile rule based upon the comparing.

This Summary section is provided merely to introduce certain concepts and not to identify any key or essential features of the claimed subject matter. Other features of the inventive arrangements will be apparent from the accompanying drawings and from the following detailed description.

BRIEF DESCRIPTION OF THE DRAWINGS

The inventive arrangements are illustrated by way of example in the accompanying drawings. The drawings, however, should not be construed to be limiting of the inventive arrangements to only the particular implementations shown. Various aspects and advantages will become apparent upon review of the following detailed description and upon reference to the drawings.

FIG. 4 illustrates an example of a user interface (UI) that may be generated and provided by a system as described herein.

FIG. 5 illustrates another example of a UI that may be generated and provided by a system as described herein.

FIG. 6 illustrates another example of a UI that may be generated and provided by a system as described herein.

FIG. 7 illustrates another example of a UI that may be generated and provided by the system.

DETAILED DESCRIPTION OF THE DRAWINGS

Figure 1:
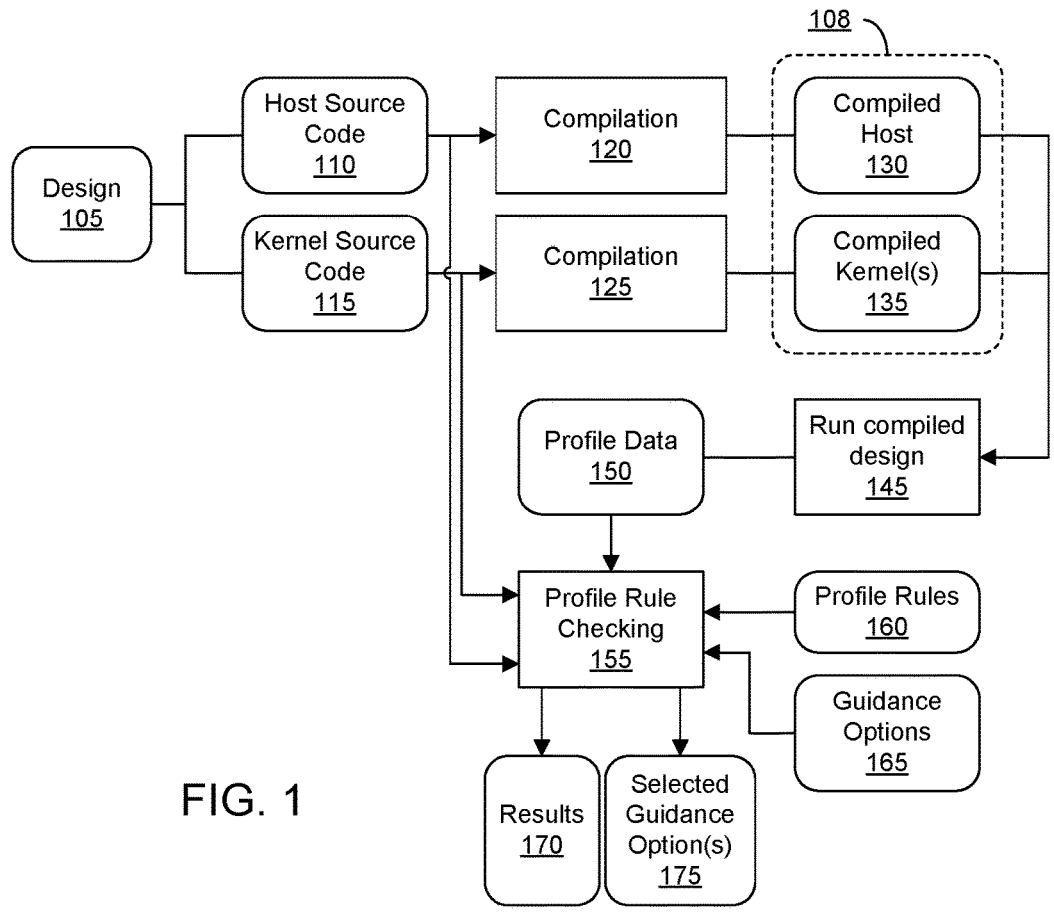
FIG. 1 illustrates a high level flow for evaluating a design for a heterogeneous computing (HC) platform.

While the disclosure concludes with claims defining novel features, it is believed that the various features described within this disclosure will be better understood from a consideration of the description in conjunction with the drawings. The process(es), machine(s), manufacture(s) and any variations thereof described herein are provided for purposes of illustration. Specific structural and functional details described within this disclosure are not to be interpreted as limiting, but merely as a basis for the claims and as a representative basis for teaching one skilled in the art to variously employ the features described in virtually any appropriately detailed structure. Further, the terms and phrases used within this disclosure are not intended to be limiting, but rather to provide an understandable description of the features described.

This disclosure relates to heterogeneous computing (HC) platforms and, more particularly, to implementation and evaluation of designs for HC platforms with hardware acceleration. A design for an HC platform is typically specified using one or more high level programming languages (HLLs). In this regard, the design may be referred to as an HLL design. One or more kernels of the HLL design may be designated for hardware acceleration. As such, these kernels are ultimately implemented as circuitry within an integrated circuit (IC) coupled to the host processor of the HC platform as a device.

In some cases, the implementation tools that operate on the HLL design suffer from observability issues. For example, the relationships between aspects of the resulting hardware implementation and features of the HLL design are not always clear, particularly since many kernel developers lack hardware design experience. Operations such as high level synthesis, integration of the kernel with supporting hardware within the IC, etc., may be hidden or abstracted from view of the kernel developer. In consequence, a kernel developer may have difficulty understanding how to improve a given HLL design to achieve improved performance.

One or more embodiments described within this disclosure address these difficulties. In one aspect, the HLL design may be run to collect profile data relating to operation of the HLL design. A system is capable of evaluating performance of the HLL design through a comparison of the profile data with one or more predetermined profile rules. The profile rules may be system level rules or user-specific (e.g., user-specified) rules. In one aspect, the profile rules specify operating or performance requirements for the implemented HLL design. Based upon compliance of the design with the profile rules, the system is capable of providing one or more guidance options. The guidance options, for example, can provide suggestions or instructions for improving the HLL design in order to better achieve objectives expressed by the profile rules.

One or more embodiments are directed to a method of evaluating design requirements for an HC platform as performed by a data processing system. One or more embodiments are directed to a system that is adapted to evaluate design requirements for an HC platform. One or more embodiments are directed to a computer program product including a computer readable storage medium having program code stored thereon for evaluating design requirements for an HC platform.

Further aspects of the inventive arrangements are described below in greater detail with reference to the figures. For purposes of simplicity and clarity of illustration, elements shown in the figures have not necessarily been drawn to scale. For example, the dimensions of some of the elements may be exaggerated relative to other elements for clarity. Further, where considered appropriate, reference numbers are repeated among the figures to indicate corresponding, analogous, or like features.

FIG. 1 illustrates a high level flow for evaluating a design for an HC platform. The flow illustrated in FIG. 1 may be performed by a data processing system such as a computer. In an example, the flow of FIG. 1 may be performed by a single data processing system. In another example, the flow of FIG. 1 may be performed by one or more data processing systems. An example of a data processing system is provided herein with reference to FIG. 2. Accordingly, the various blocks illustrated in FIG. 1 represent processes performed by the data processing system. For example, the blocks are performed by a processor of a system executing suitable program code.

In the example of FIG. 1, a design 105 is provided. Design 105 is for an HC platform. An HC platform includes a host processor and one or more devices communicatively linked with the host processor. For purposes of illustration, at least one or more of the devices are ICs used to hardware accelerate one or more kernels specified within design 105. Examples of devices, or ICs, used to hardware accelerate kernels can include, but are not limited to, programmable ICs such as field programmable gate arrays (FPGAs), system-on-chips including programmable circuitry (e.g., a portion of FPGA circuitry), application specific integrated circuits that include at least some programmable circuitry, and so forth.

Design 105 is specified using an HLL or a combination of HLLs. Examples of HLLs include, but are not limited to, C, C++, OpenCL, and so forth. Design 105 includes host source code 110 and kernel source code 115. Kernel source code 115 may be for one or more different kernels. As pictured, host source code 110 is compiled through block 120. Block 120 generates a compiled host 130. Compiled host 130 may be implemented as executable instructions that are executable by a processor, e.g., object code. For instance, compiled host 130 is executable by the host processor of the HC platform. Kernel source code 115 is compiled through block 125. Block 125 can generate compiled kernels 135.

In block 145, compiled design 108, e.g., compiled host 130 and compiled kernels 135, is run to generate profile data 150. In one aspect, compiled design 108 is run by implementing compiled design 108 within an actual HC platform. For example, compiled host 130 may be executed by the host processor of the HC platform. Compiled kernels 135 may be hardware accelerated as kernel circuits implemented within an IC operating as a device of the host processor. In that case, block 125 may synthesize, place, and route kernel source code 115. For example, block 125 may generate compiled kernel(s) 135 as a configuration bitstream or configuration bitstreams that may be loaded into an IC thereby implementing the kernel(s) as kernel circuit(s) therein.

Block 125 is also capable of including monitor circuitry within compiled kernels 135. The monitor circuitry collects and/or processes data from operation of compiled design 108 to generate profile data 150. For example, the monitor circuitry may capture start and stop times of kernel circuit operation, information about data transfers to and from kernel circuits, bus transactions, and so forth.

In another aspect, compiled design 108 is run by simulating compiled design 108 using a data processing system. For example, compiled host 130 may be executed by a host processor or a data processing system such as a simulator adapted to simulate design 108 as if implemented in the HC platform. In that case, block 125 is capable of generating compiled kernels 135 as executable program code, e.g., object code. The compiled kernels 135 are adapted to model behavior of the kernel(s) as if hardware accelerated as kernel circuits. Accordingly, the compiled kernels 135 are executable program code that may be executed by the data processing system as part of a simulation. The simulator is capable of monitoring operation of the simulated elements of design 105.

In one aspect, block 125 may instrument the kernels with diagnostic program code that executes as part of compiled kernel(s) 135 to generate profile data 150. Data collected by execution of design 108 using a simulator, for example, may be stored as profile data 150 in memory.

In still another aspect, whether design 108 is simulated or implemented in an HC platform, block 120 may instrument compiled host 130 in order to generate profile data 150 relating to operation of compiled host 130. Thus, profile data 150 may include data relating to operation of the kernel portion of design 105 and/or operation of the host portion of design 105.

Block 155 performs profile rule checking. In an aspect, profile data 150 is evaluated with respect to profile rules 160. Profile rules 160 may be stored in a data storage device. In one example implementation, profile rules 160 may be stored within a database. It should be appreciated, however, that profile rules 160 may be stored in any of a variety of different data structures and/or files within the data storage device, e.g., one or more text files, eXtensible Markup Language (XML) files, etc.

As an illustrative example, each profile rule may specify a design requirement for an implementation of design 105. A design requirement refers to an operating and/or performance requirement. Examples of performance requirements can include, but are not limited to, data transfer rate, latency, etc. Block 155 is capable of determining whether design 105 complies with design rules 160 by comparing profile rules 160 with profile data 150. Block 155, for example, may perform the comparison of profile data 150 with profile rules 160 and output results 170. Results 170 can indicate compliance of design 105, or an implementation thereof, with one or more of profile rules 160.

In another aspect, profile rules 160 may include one or more source code analysis rules. Block 155 is capable of analyzing host source code 110 by comparing the source code analysis rules of profiles rules 160 with host source code 110. Block 155 is capable of analyzing kernel source code 115 by comparing the source code analysis rules of profile rules 160 with kernel source code 115. Block 155, for example, can output an indication of whether design 105 complies with the source code analysis rules. In an aspect, block 155 may provide these indications, whether for performance requirements and/or source code analysis rules, as part of results 170 for host source code 110, for kernel source code 115, or for both.

In another aspect, block 155 is capable of determining, or selecting, one or more of guidance options 165 based upon compliance with profile rules 160. Guidance options 165, for example, may be stored in a data storage device. In one aspect, guidance options 165 are stored within a database. It should be appreciated, however, that guidance options 165 may be stored in any of a variety of different data structures and/or files within the data storage device, e.g., as one or more text files, XML files, etc.

Guidance options 165 provide instruction on optimizing design 105 to improve performance. Guidance options 165 may be correlated with particular ones of profile rules 160, which may include the source code analysis rules. In one aspect, each guidance option 165 is correlated with one or more profile rules 160. For example, in response to determining that design 105 does not comply with a selected profile rule, block 155 may retrieve one or more guidance options 165 that are correlated, or associated, with the selected profile rule and output those particular guidance option(s) 165 as selected guidance options 175.

In one aspect, in determining whether design 105 complies with a profile rule, block 155 may make a binary decision. For example, design 105 either compiles or does not. In another aspect, in determining whether design 105 complies with a profile rule, block 155 may determine one or more different levels of compliance based upon the requirement(s) of the profile rule.

Figure 2:
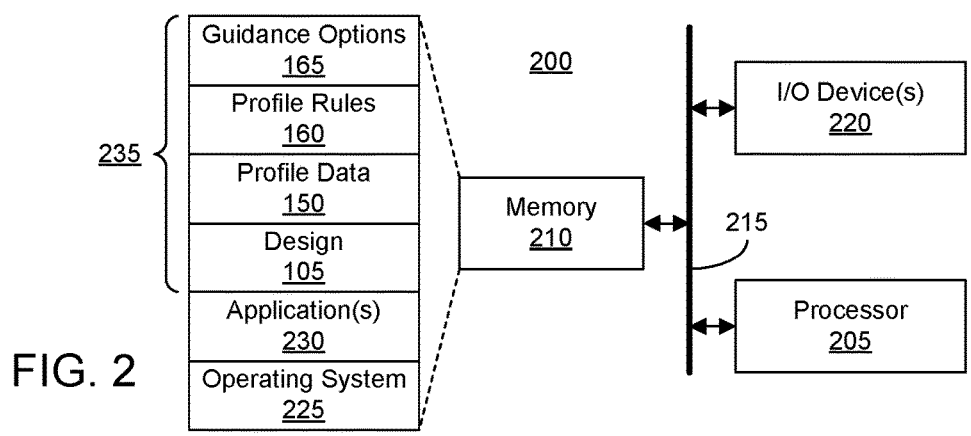
FIG. 2 illustrates an example data processing system.

FIG. 2 illustrates an example data processing system (system) 200. System 200, for example, may be used to implement the various operations, e.g., blocks, described in connection with FIG. 1.

As pictured, system 200 includes at least one processor 205 coupled to a memory 210 through interface circuitry 215. Examples of interface circuitry 215 include but are not limited to, an input/output (I/O) subsystem, an I/O interface, a bus system, a memory interface, or other suitable circuitry. System 200 stores computer readable instructions (also referred to as "program code") within memory 210. Memory 210 may be considered an example of various forms of computer readable storage media. Processor 205 executes the program code accessed from memory 210 via interface circuitry 215.

Memory 210 can include one or more physical memory devices such as, for example, a local memory and one or more bulk storage devices. Local memory refers to random access memory (RAM) or other non-persistent memory device(s) generally used during actual execution of the program code. A bulk storage device may be implemented as a non-volatile memory such as a hard disk drive (HDD), a solid state drive (SSD), or another persistent data storage device. System 200 may also include one or more cache memories (not shown) that provide temporary storage of at least some program code in order to reduce the number of times program code must be retrieved from the bulk storage device during execution.

System 200 may be coupled to one or more I/O devices 220. Examples of I/O devices 220 can include, but are not limited to, a keyboard, a display device, a pointing device, one or more network adapters, and so forth. A network adapter enables system 200 to become coupled to other systems, computer systems, remote printers, and/or remote storage devices. Examples of network adapters may include, but are not limited to, modems, Ethernet cards, bus adapters, wireless transceivers and/or radios, and so forth. System 200 may include one or more additional I/O device(s) beyond the examples provided. I/O devices 220 may be coupled to system 200 either directly or through intervening I/O controllers.

As pictured, memory 210 may store an operating system 225, one or more application(s) 230, and data 235. As illustrated, data 235 may include design 105, profile data 150, profile rules 160, and guidance options 165. Application 230, for example, may be an electronic design automation (EDA) application, a simulator, a High Level Synthesis (HLS) application, and/or a combination thereof. In one aspect, operating system 225 and application(s) 230, being implemented in the form of executable program code, are executed by system 200 and, more particularly, by processor 205, to perform the various operations described within this disclosure. As such, operating system 225 and application 230 may be considered an integrated part of system 200.

Any data such as data 235 that is used, generated, and/or operated upon by system 200 are functional data structures that impart functionality when employed as part of system 200 or are provided to an IC for implementation therein. A "data structure" refers to a physical implementation of a data model's organization of data within a physical memory. As such, a data structure is formed of specific electrical or magnetic structural elements in a memory. A data structure imposes physical organization on the data stored in the memory as used a processor executing program code instructions.

System 200 may include fewer components than shown or additional components not illustrated in FIG. 2 depending upon the particular type of device that is implemented. In addition, the particular operating system and/or application(s) included may vary according to device type as may the types of network adapter(s) included. For example, particular data structures such as profile data 150, profile rules 160, and/or guidance options 165 may be stored in other computing systems, e.g., a database, accessible to system 200. Further, one or more of the illustrative components may be incorporated into, or otherwise form a portion of, another component. For example, a processor may include at least some memory.

Figure 3:
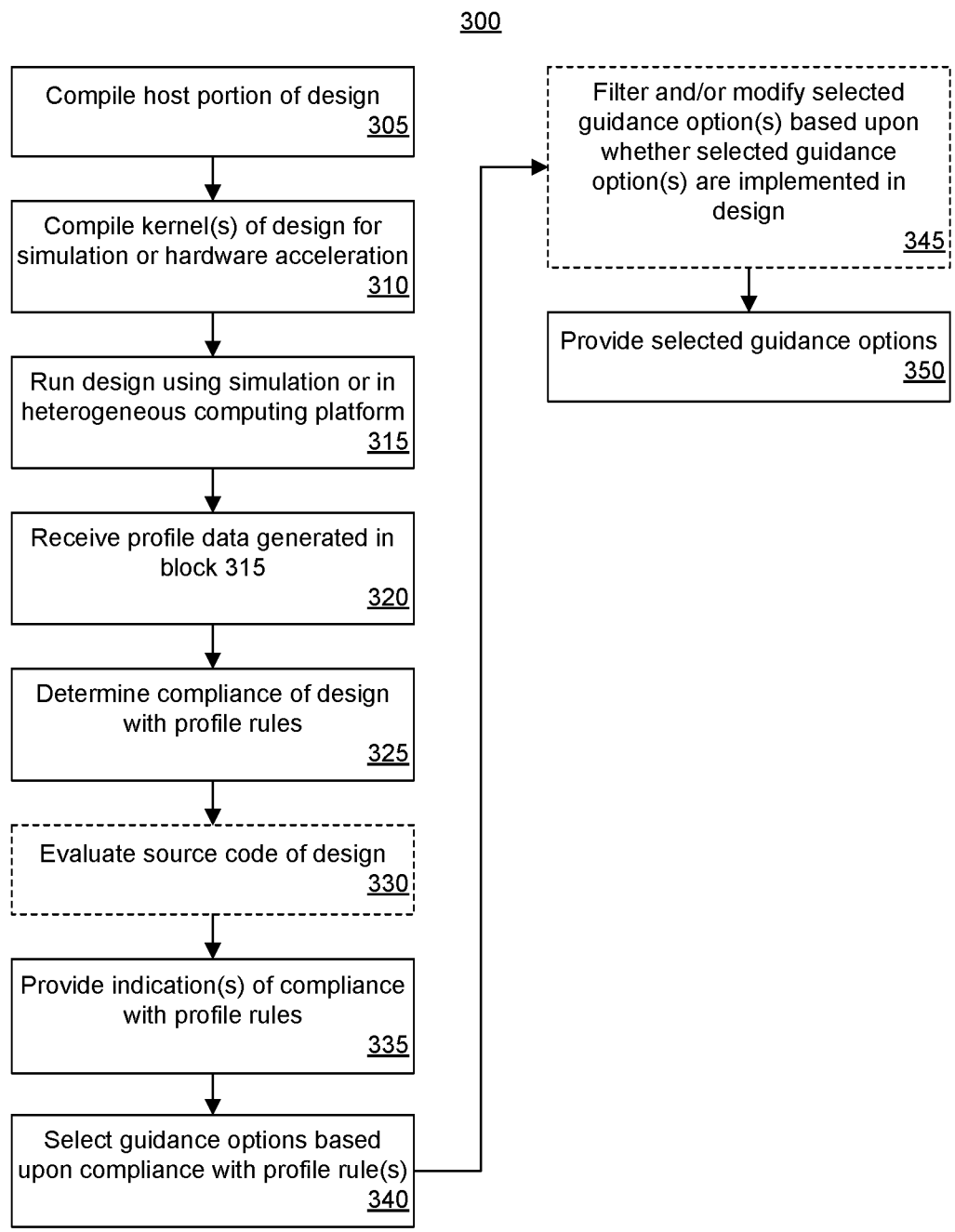
FIG. 3 illustrates an example method of evaluating and implementing a design for an HC platform.

FIG. 3 illustrates an example method 300 of evaluating and implementing a design for an HC platform. Method 300 illustrates various operations relating to evaluation of requirements for the design and providing guidance options. Method 300 may be performed by a system such as system 200 described in connection with FIG. 2. Method 300 may begin in a state where a design for an HC platform is specified in an HLL. In block 305, the system compiles the host portion of the design. The system compiles the host portion of the design into executable program code.

In block 310, the system compiles the kernel portion, or kernels, of the design. As discussed, the system is capable of compiling the kernels into one of a plurality of different formats depending upon whether the design is to be run using simulation or run with the kernel(s) being hardware accelerated and implemented as circuitry within an IC. In this regard, it should be appreciated that in the simulation case, the simulation is simulating operation of the kernel(s) as hardware accelerated circuits. Thus, the executable program code that is generated in the simulation case models operation of the kernels when hardware accelerated and implemented in an IC as kernel circuits.

In block 315, the design is run. The design may be run using the system that compiles the design or another system in the case of simulation. The design may be run in an HC platform that includes a device adapted to implement the kernel(s) in hardware. In any case, running the design generates profile data. The profile data, in general, includes various quantities that indicate the operating performance of the host processor, kernels, or both.

Examples of profile data that may be collected include, but are not limited to, data relating to data transfers between the host processor and the kernel, runtime of the kernel to complete a processing task, kernel and compute unit utilization, host and kernel bandwidth utilization, functional tests, etc. Regarding data transfers, example profile data that may be collected can include kernel read size (for data), kernel write size (for data), kernel read utilization, kernel write utilization, amount or size of total kernel data read, host read transfers from off-chip global memory, host write transfers to off-chip global memory, compute unit utilization (number of compute units of a kernel used and/or amount of usage of particular compute units of the kernel), kernel utilization of work groups, available device usage, etc.

In block 320, the system obtains or receives the profile data generated in block 315. In one aspect, the profile data is data generated during a simulation of the kernels and/or the host processor. In another aspect, the profile data is generated from a physical implementation of the kernel(s) in an IC, where data is offloaded from the IC to the system for analysis. In any case, the system is capable of storing the profile data in memory for subsequent analysis.

In block 325, the system determines compliance of the design with the profile rules. For example, the system compares the profile data with the profile rules. The profile rules may specify one or more operating performance rules for the kernels, for the host processor, or for both the host processor and the kernel(s). In one aspect, the operating performance rules are performance requirements for the design. An operating performance rule, for example, may specify a minimum threshold value or a maximum threshold value for one or more of the quantities listed above. The system is capable of comparing the quantities within the profile data to the relevant thresholds of the profile rules to determine whether each respective profile rule is met. In one aspect, the comparisons may determine whether each occurrence of such a transaction complies with the profile rule. In another aspect, the system may determine whether an average of the different occurrences of a given transaction within the profile data comply with the profile rule.

As an illustrative example, a profile rule may specify a minimum kernel read data size, a minimum kernel write data size, a minimum kernel read data utilization, a minimum kernel write utilization, etc. For example, data transfers between the host processor and the kernels may occur through a shared memory (e.g., the global memory). The profile rules may specify requirements relating to the size and/or frequency of such data transfers.

Other examples of profiles rules may specify that each compute unit is utilized at least one time for a run of the design. Another example profile rule may specify an upper threshold for calling compute units to ensure that the compute units are not called too often as the HC system incurs overhead or a setup penalty in calling the compute units. A profile rule may specify a compute unit utilization specifying a desired number of compute units that should be used (or a range) and/or amount or range that each compute unit should be used for efficient operation. Another example profile rule may specify that each device of the HC platform is used at least one time.

In another example, one or more of the profile rules can specify a functional check for the design. For purposes of illustration, the design may use kernels to process frames of high definition video. Since the size of a frame of high definition video is known, an example of a profile rule specifying a functional test is a profile rule specifying a target amount of data that is to be transferred to a kernel for processing. The target amount can be the size of a frame of high definition video. The system may determine whether the design complies with the profile rule. In another example, a first profile rule may specify a minimum threshold that is slightly less than the amount of a data for a frame of high definition video and/or a second profile rule that specifies a maximum threshold that is slightly more than the amount of data for a frame of high definition video. In the case where the design does not comply with the profile rule(s), the system effectively determines that an incorrect amount of data is provided to the kernel for processing indicating an error condition. The amount of data transferred may be too large or too small based upon the threshold amount of data specified within the profile rule(s) depending upon the particular application.

Examples of profile rules relating to the host portion of the design can include rules used to evaluate data transfers to the kernel. An example of a rule would check for multiple transfers of data from the host processor to the kernel by way of the shared memory. The profile rule, for example, may specify an upper threshold amount of data and a minimum number of transfers. The system, in comparing the profile rule with the profile data is capable of detecting a number of transfers that exceed a threshold where the size of each such data transfer, or an average size, is below a data size threshold. The system, in evaluating the profile rule and comparing the profile rule to the profile data, may determine that the host processor transfers 1 MB of data to global memory in 1 kB chunks so that the kernel may access the data. To move 1 MB of data, the host processor employs one thousand such transfers as opposed to transferring the entire 1 MB of data in a single transaction. The system, in comparing the profile data to the profile rule, determines that that the host processor uses too many transfers of too little data, thereby violating the profile rule.

Further examples of profile data and profile rules are described with reference to FIGS. 4-6.

In block 330, the system optionally evaluates the source code of the design. In one aspect, profile rules may include source code analysis rules. The system is capable of inspecting the source code of the design. For example, the system is capable of comparing the source code of the design, whether the host portion, the kernel portion(s), or both, with the source code analysis rules.

In one aspect, the source code analysis rules may specify a preference for particular functions over other functions. As an illustrative example, the source code analysis rules may specify a preferred type of function to be used to transfer data between the host processor and the hardware accelerated kernel. As noted, the host processor and kernels circuits transfer data via share memory. In comparing the source code analysis rule to the source code of the design, the system is able to identify those functions used to transfer data from the host processor to the hardware accelerated kernel by way of the shared memory, from the hardware accelerated kernel to the host processor by way of the shared memory, etc. The system is able to determine whether the function is one that is "preferred" as specified by the source code analysis rule.

For example, a source code analysis rule may indicate that the "async_work_group_copy" function in OpenCL is a preferred data transfer function. The preferred function, for example, may be one that is known for implementing efficient and fast data transfers. The system may, through an analysis of the source code, determine whether this profile rule is met. The system may analyze the source code of the host portion of the design, the kernel portion of the design, or both for use of preferred data transfer functions.

In another illustrative example, a source code analysis rule may indicate that a data transfer function preferably transfers a minimum amount of data or a particular amount of data. The system may analyze the source code of the host portion of the design, the kernel portion of the design, or both for use of a preferred data transfer size or amount within the data transfer functions used.

In another illustrative example, a source code analysis rule may indicate that a data transfer function preferably uses vectors. For instance, the IC used for hardware acceleration may provide set infrastructure to which the hardware accelerated kernel may couple. This infrastructure may include a predetermined or fixed data bus, I/O interfaces, memory interfaces (e.g., memory controllers), etc. In illustration, the infrastructure may provide a data bus to a memory, e.g., an off-chip memory, that is 512 bits in width. In that case, the source code analysis rule may check whether the data transfer function uses vectors so that rather than requesting a single 32-bit word of data at a time, the data transfer function requests 16 values each being 32 bits in order to utilize the entire width of the data bus to increase operational efficiency. The system may analyze the source code of the host portion of the design, the kernel portion of the design, or both for use of vectors.

Another example of a profile rule for source code analysis is to check whether the data transfer function that provides data to the kernel occurs at the time, or within a predetermined amount of time of, invoking the kernel. Providing data to the kernel at the time of invoking the kernel instead of prior to the kernel starting operation is preferred and offers improved performance.

In another example implementation, the system is capable of using only selected profile rules in the comparing. The system may include profile rules that are applicable only to C, only to C++, and/or only to OpenCL. In one aspect, the system is capable of detecting the particular source code HLL used to specify the portion(s) of the design and utilize the relevant profile rules. In another aspect, the developer may indicate which set of rules to utilize.

In another example implementation, the system may be adapted to apply the source code analysis rules in response to determining that the design does not comply with one or more profile rules. In another example implementation, the system may be adapted to apply the source code analysis rules as part of compilation prior to generating any profile data.

In block 335, the system is capable of indicating compliance with the profile rules. For example, the system is capable of indicating which profile rules are met and/or not met. The system is capable of outputting results, e.g., indications, of compliance with the profile rules. In one aspect, compliance is indicated on a per rule basis. As an illustrative example, the system is capable of generating a report and providing the information via a user interface that may be displayed using a display device.

In block 340, the system is capable of selecting one or more guidance options based upon compliance with the profile rules. For example, the system may select guidance options for those design rules that are not met. The system may include a database of guidance options. Each guidance option can specify instructions for modifying the design, e.g., the source code of the host portion of the design or the source code of the kernel portion of the design, in order to improve operating performance of the resulting system as implemented in an HC platform.

In one aspect, the guidance options are correlated, or associated, with the profile rules. The system is capable of selecting a guidance option associated with a selected profile rule that is not met. The selected guidance option can provide instructions for modifying the design in order to meet the selected profile rule. Each profile rule may be associated with one or more than one guidance option.

As an illustrative example, a profile rule may specify a minimum kernel read data size. A guidance option associated with the profile rule may specify instructions relating to how to modify the design by increasing the kernel read data size and/or increase the kernel read data size to a preferred amount, etc.

Another example of a guidance option is to suggest the use and/or inclusion of optimization pragmas for the kernel(s). Optimization pragmas are compiler directives that provide implementation guidance to the compilation/synthesis tools for compiling the kernel source code. The optimization pragmas indicate particular structural implementations to be implemented in the resulting circuit design and/or circuitry that is generated for the kernel(s).

In one aspect, optimization pragmas may be included or added within the source code of the kernel(s). In another aspect, optimization pragmas may be added to a data structure other than the source code of the kernel(s). The other data structure may be associated with the kernel(s) and/or read by the system during compilation of the kernel(s). For example, the optimization pragmas may be added to a database, specified as a script (e.g., a Tcl script, or the like), as metadata, a project setting for the EDA tools, etc. In either case, the system reads the optimization pragmas and implements the optimization pragmas during compilation.

For example, one optimization pragma specify that loop unrolling should be performed in compiling the kernel source code. The optimization pragma may specify an amount of loop unrolling to be performed. Another optimization program may specify that pipelining should be performed. Another optimization pragma may specify using dataflow mode where processing starts as soon as data is available.

In block 345, the system optionally filters and/or modifies the selected guidance options based upon whether the selected guidance option(s) are implemented in the design. For example, the system may compare the set of selected guidance options with results obtained from the source code analysis. The system is capable of removing guidance options from the set of selected guidance options that provide instructions to modify the design in a way that is already implemented in the design. As an illustrative example, the system is capable of removing a guidance option that instructs the user to use a preferred data transfer function from the set of selected guidance options when the source code analysis indicates that the design is already using the preferred data transfer function. Similarly, the system is capable of removing a guidance option that instructs the user to use vector processing from the set of selected guidance options when the source code analysis indicates that the design is already using vector processing.

In another example, the system may remove a guidance option that is for an HLL not used to specify the kernel. For example, the system may filter or remove a guidance option specifying an OpenCL construct in the case where the kernel is specified in C++. In another example, the system may vary the guidance provided based upon usage of optimization pragmas. For example, the system may remove a guidance option to include a particular optimization pragma when the system detects that optimization pragma within the kernel source code of the design or within another data structure utilized for compiling the kernel source code. In another example, when the system determines that the kernel source code or other data structure already includes a particular type of optimization pragma, the system may vary or modify the detail of the guidance option by including additional instruction about changing the arguments or attributes of the optimization pragma.

In block 350, the system provides the selected guidance option(s). In one aspect, the guidance option may be listed providing general instructions. In another aspect, the guidance option may be listed by title or by providing a link to the guidance option or more detailed information for the guidance option. In another aspect, the guidance option may provide a specific example or correction of source code of the design. For example, the system is capable of listing the portion, or portions, of the source code found to violate a particular profile rule and highlight the portion that is found to violate the profile rule.

FIG. 4 illustrates an example of a user interface (UI) 400 that may be generated and provided by the system. In the example of FIG. 4, UI 400 provides results from a comparison of profile data with profile rules relating to kernel data transfers. In general, each row of UI 400 corresponds to a particular profile rule.

The left most column labelled "Kernel Data Transfer" specifies the type of data transfer that is evaluated by the profile rule. The "threshold value" column indicates the particular threshold value of the profile rule that the system compares to the profile data to determine whether the profile rule is met. The "actual value" column specifies the value from the profile data that is found by the system and compared to the relevant threshold value for the profile rule. The "conclusion" column indicates compliance with the profile rule, e.g., whether the profile rule is met. The "Details" column provides additional information relating to the conclusion. The "Guidance Option" column provides a recommended action or instruction for correcting the problem so that the design may comply with the profile rule that is not met. In one aspect, the data provided in the "Guidance Option" column may be a link or hyperlink to more detailed information or instructions for the guidance option.

FIG. 5 illustrates an example of a UI 500 that may be generated and provided by the system. In the example of FIG. 5, UI 500 provides results from a comparison of profile data with profile rules relating to host data transfers. In general, each row of UI 500 corresponds to a particular profile rule.

FIG. 6 illustrates an example of a UI 600 that may be generated and provided by the system. In the example of FIG. 6, UI 600 provides results from a comparison of profile data with profile rules relating to resource utilization. In general, each row of UI 600 corresponds to a particular profile rule.

FIG. 7 illustrates an example of a UI 700 that may be generated and provided by the system. In the example of FIG. 7, UI 700 provides example guidance options. For example, UI 700 provides guidance options such as vectorization, loop unrolling, pipelining, and maximizing port widths in response to determining that one or more profile rules are not met. UI 700 further provides example guidance showing example source code.

In one aspect, the "Not Recommended" portion and the "Recommended" portions of source code may be provided as general examples that are not specific to the user's actual design. The examples of recommended and not recommended source code illustrate that vector processing should be used. As noted, in one aspect, the system may provide the guidance option of FIG. 7 and/or the guidance options of FIGS. 4-6 based upon compliance of the design with the profile rules, e.g., which of the profile rules are not being met or complied with. In another aspect, the guidance option of FIG. 7 and/or the guidance options of FIGS. 4-6 may be provided based upon the profile rules that are not met and a determination that the design does not implement the particular guidance options being provided.

In another aspect, the "Not Recommended" portion may be an actual portion of source code found from within the user's design. In this example, the system has extracted the source code as an illustrative portion that does not meet a profile rule. Further, the system has provided a corrected or updated version of the source code where vector processing is used.

In one aspect, the system is capable of presenting UI 700 in response to a user selection of a guidance option (e.g., a reference or name of a guidance option) as presented in FIG. 4 in the "Guidance Option" column. For example, the system provides more explicit or specific information in response to a user selection of a guidance option from UI 400. The information, or next steps, shown in UI 700, for example, may include "best practices" that improve the performance of the kernel. In addition to providing sample source code, the guidance option(s) may include links or other references to pertinent documentation.

In another aspect, the system may allow users to specify their own profile rules. As an example, a user may select a generic rule from a library of available rules. The user may then specify a particular threshold value for the profile rule based upon expected performance of the design. For purposes of illustration, consider the case where a kernel is processing high definition video in real time. In that case, the user may adjust or set a profile rule that checks the kernel runtime and specifies a threshold (e.g., a not to exceed threshold) of 1/60 of second.

In one aspect, the system may provide a variety of different types of profile rules. A user may select those rules that are to be used in evaluating and/or comparing the profile data. In addition, the user may specify the particular thresholds that are to be used for a profile rule when activated for use in the analysis described herein.

It should be appreciated that the particular examples of profile rules provided within this disclosure are for purposes of illustration only. In this regard, the profile rules are not intended to be limited to the specific examples provided. The profile rules, for example, may be extended to include rules relating to other criteria including, but not limited to, resources utilization, power utilization, or the like.

For purposes of explanation, specific nomenclature is set forth to provide a thorough understanding of the various inventive concepts disclosed herein. The terminology used herein, however, is for the purpose of describing particular aspects of the inventive arrangements only and is not intended to be limiting.

As defined herein, the singular forms "a," "an," and "the" are intended to include the plural forms as well, unless the context clearly indicates otherwise. As defined herein, the term "another" means at least a second or more. As defined herein, the terms "at least one," "one or more," and "and/or," are open-ended expressions that are both conjunctive and disjunctive in operation unless explicitly stated otherwise. For example, each of the expressions "at least one of A, B and C," "at least one of A, B, or C," "one or more of A, B, and C," "one or more of A, B, or C," and "A, B, and/or C" means A alone, B alone, C alone, A and B together, A and C together, B and C together, or A, B and C together. As defined herein, the term "automatically" means without user intervention.

As defined herein, the term "computer readable storage medium" means a storage medium that contains or stores program code for use by or in connection with an instruction execution system, apparatus, or device. As defined herein, a "computer readable storage medium" is not a transitory, propagating signal per se. A computer readable storage medium may be, but is not limited to, an electronic storage device, a magnetic storage device, an optical storage device, an electromagnetic storage device, a semiconductor storage device, or any suitable combination of the foregoing.

Memory elements, as described herein, are examples of a computer readable storage medium. A non-exhaustive list of more specific examples of a computer readable storage medium may include: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing.

As defined herein, the term "output" means storing in physical memory elements, e.g., devices, writing to display or other peripheral output device, sending or transmitting to another system, exporting, or the like.

As defined herein, the term "high level programming language" means a programming language, or set of instructions, used to program a data processing system where the instructions have a strong abstraction from the details of the data processing system, e.g., machine language. For example, a high level programming language may automate or hide aspects of operation of the data processing system such as memory management. The amount of abstraction typically defines how "high level" the programming language is. Using a high level programming language frees the user from dealing with registers, memory addresses, and other low level features of the data processing system upon which the high level programming language will execute. In this regard, a high level programming language includes little or no instructions that translate directly, on a one-to-one basis, into a native opcode of a data processing system. Examples of high level programming languages include, but are not limited to, C, C++, SystemC, OpenCL, or the like.

As defined herein, the term "if" means "when" or "upon" or "in response to" or "responsive to," depending upon the context. Thus, the phrase "if it is determined" or "if [a stated condition or event] is detected" may be construed to mean "upon determining" or "in response to determining" or "upon detecting [the stated condition or event]" or "in response to detecting [the stated condition or event]" or "responsive to detecting [the stated condition or event]" depending on the context. As defined herein, the term "responsive to" means responding or reacting readily to an action or event. Thus, if a second action is performed "responsive to" a first action, there is a causal relationship between an occurrence of the first action and an occurrence of the second action. The term "responsive to" indicates the causal relationship.

As defined herein, the term "processor" means at least one hardware circuit configured to carry out instructions contained in program code. The hardware circuit may be an integrated circuit. Examples of a processor include, but are not limited to, a central processing unit (CPU), an array processor, a vector processor, a digital signal processor (DSP), a field-programmable gate array (FPGA), a programmable logic array (PLA), an application specific integrated circuit (ASIC), programmable logic circuitry, a graphics processing unit (GPU), a controller, and so forth.

As defined herein, the term "real time" means a level of processing responsiveness that a user or system senses as sufficiently immediate for a particular process or determination to be made, or that enables the processor to keep up with some external process. As defined herein, the term "user" means a human being. The terms first, second, etc. may be used herein to describe various elements. These elements should not be limited by these terms, as these terms are only used to distinguish one element from another unless stated otherwise or the context clearly indicates otherwise.

A computer program product may include a computer readable storage medium (or media) having computer readable program instructions thereon for causing a processor to carry out aspects of the inventive arrangements described herein. Within this disclosure, the term "program code" is used interchangeably with the term "computer readable program instructions." Computer readable program instructions described herein may be downloaded to respective computing/processing devices from a computer readable storage medium or to an external computer or external storage device via a network, for example, the Internet, a LAN, a WAN and/or a wireless network. The network may include copper transmission cables, optical transmission fibers, wireless transmission, routers, firewalls, switches, gateway computers and/or edge devices including edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations for the inventive arrangements described herein may be assembler instructions, instruction-set-architecture (ISA) instructions, machine instructions, machine dependent instructions, microcode, firmware instructions, or either source code or object code written in any combination of one or more programming languages, including an object oriented programming language and/or procedural programming languages. Computer readable program instructions may include state-setting data. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a LAN or a WAN, or the connection may be made to an external computer (for example, through the Internet using an Internet Service Provider). In some cases, electronic circuitry including, for example, programmable logic circuitry, an FPGA, or a PLA may execute the computer readable program instructions by utilizing state information of the computer readable program instructions to personalize the electronic circuitry, in order to perform aspects of the inventive arrangements described herein.

Certain aspects of the inventive arrangements are described herein with reference to flowchart illustrations and/or block diagrams of methods, apparatus (systems), and computer program products. It will be understood that each block of the flowchart illustrations and/or block diagrams, and combinations of blocks in the flowchart illustrations and/or block diagrams, may be implemented by computer readable program instructions, e.g., program code.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the operations specified in the flowchart and/or block diagram block or blocks.

The computer readable program instructions may also be loaded onto a computer, other programmable data processing apparatus, or other device to cause a series of operations to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various aspects of the inventive arrangements. In this regard, each block in the flowchart or block diagrams may represent a module, segment, or portion of instructions, which comprises one or more executable instructions for implementing the specified operations.

In some alternative implementations, the operations noted in the blocks may occur out of the order noted in the figures. For example, two blocks shown in succession may be executed substantially concurrently, or the blocks may sometimes be executed in the reverse order, depending upon the functionality involved. In other examples, blocks may be performed generally in increasing numeric order while in still other examples, one or more blocks may be performed in varying order with the results being stored and utilized in subsequent or other blocks that do not immediately follow. It will also be noted that each block of the block diagrams and/or flowchart illustration, and combinations of blocks in the block diagrams and/or flowchart illustration, may be implemented by special purpose hardware-based systems that perform the specified functions or acts or carry out combinations of special purpose hardware and computer instructions.

The corresponding structures, materials, acts, and equivalents of all means or step plus function elements that may be found in the claims below are intended to include any structure, material, or act for performing the function in combination with other claimed elements as specifically claimed.

A method of implementing a design for an HC platform can include storing, using a processor, profile data in a memory, wherein the profile data is generated from running the design for the HC platform and wherein the design includes a kernel adapted for hardware acceleration. The method can include determining compliance of the design with a profile rule by comparing, using the processor, the profile data accessed from the memory with the profile rule. The profile rule specifies a design requirement for a hardware accelerated implementation of the kernel. The method can include indicating, using the processor, compliance of the design with the profile rule based upon the comparing.

In an aspect, the method can include selecting a guidance option associated with the profile rule from the memory based upon compliance of the design with the profile rule and providing the guidance option.

In another aspect, the guidance option includes recommending use of an optimization pragma.

In another aspect, the guidance option is presented in response to determining that the design does not implement the guidance option by inspecting source code of the design.

In another aspect, the method can include detecting a function in source code of the design, wherein the detected function is adapted to exchange data between a shared memory of a host processor of the HC platform and the kernel, wherein the guidance option relates to the detected function.

In another aspect, the method can include determining that the detected function does not match a preferred data transfer function, wherein the guidance option specifies using the preferred data transfer function in place of the detected function.

In another aspect, the method can include determining that the detected function does not use vector processing, wherein the guidance option specifies using vector processing for the detected function.

In another aspect, the method can include determining that the detected function transfers an amount of data that is less than a threshold amount of data, wherein the guidance option specifies increasing the amount of data transferred by the detected function.

In another aspect, the operating requirement is for kernel utilization.

A system for implementing a design for an HC platform, the system can include a memory adapted to store profile data generated from running the design for the HC platform, wherein the design includes a kernel adapted for hardware acceleration. The system can include a processor coupled to the memory and adapted to determine compliance of the design with a profile rule by comparing the profile data accessed from the memory with the profile rule. The profile rule can specify a design requirement for a hardware accelerated implementation of the kernel. The processor may be further adapted to indicate compliance of the design with the profile rule based upon the comparing.

In an aspect, the processor is further adapted to select a guidance option associated with the profile rule from the memory in based upon compliance of the design with the profile rule and provide the guidance option.

In another aspect, the guidance option includes recommending use of an optimization pragma.

In another aspect, the guidance option is presented in response to determining that the design does not implement the guidance option by inspecting source code of the design.

In another aspect, the processor is further adapted to detect a function in source code of the design. The detected function is adapted to exchange data between a shared memory of a host processor of the heterogeneous computing platform and the kernel. The guidance option relates to the detected function.

In another aspect, the processor is further adapted to determine that the detected function does not match a preferred data transfer function, wherein the guidance option specifies using the preferred data transfer function in place of the detected function.

In another aspect, the processor is further adapted to determine that the detected function does not use vector processing, wherein the guidance option specifies using vector processing for the detected function.

In another aspect, the processor is further adapted to determine that the detected function transfers an amount of data that is less than a threshold amount of data, wherein the guidance option specifies increasing the amount of data transferred by the detected function.

In another aspect, the operating requirement is for kernel utilization.

A computer program product includes a computer readable storage medium having program code stored thereon. The program code is executable by a processor to perform a method of implementing a design for an HC platform. The method can include storing, using a processor, profile data in a memory, wherein the profile data is generated from running the design for the heterogeneous computing platform and wherein the design includes a kernel adapted for hardware acceleration. The method can include determining compliance of the design with a profile rule by comparing, using the processor, the profile data accessed from the memory with the profile rule. The profile rule specifies a design requirement for a hardware accelerated implementation of the kernel. The method can include indicating, using the processor, compliance of the design with the profile rule based upon the comparing.

In an aspect, the method can include selecting a guidance option associated with the profile rule from the memory based upon compliance of the design with the profile rule and providing the guidance option.

In another aspect, the guidance option includes recommending use of an optimization pragma.

In another aspect, the guidance option is presented in response to determining that the design does not implement the guidance option by inspecting source code of the design.

In another aspect, the method can include detecting a function in source code of the design, wherein the detected function is adapted to exchange data between a shared memory of a host processor of the HC platform and the kernel, wherein the guidance option relates to the detected function.

In another aspect, the method can include determining that the detected function does not match a preferred data transfer function, wherein the guidance option specifies using the preferred data transfer function in place of the detected function.

In another aspect, the method can include determining that the detected function does not use vector processing, wherein the guidance option specifies using vector processing for the detected function.

In another aspect, the method can include determining that the detected function transfers an amount of data that is less than a threshold amount of data, wherein the guidance option specifies increasing the amount of data transferred by the detected function.

In another aspect, the operating requirement is for kernel utilization.

The description of the inventive arrangements provided herein is for purposes of illustration and is not intended to be exhaustive or limited to the form and examples disclosed. The terminology used herein was chosen to explain the principles of the inventive arrangements, the practical application or technical improvement over technologies found in the marketplace, and/or to enable others of ordinary skill in the art to understand the inventive arrangements disclosed herein. Modifications and variations may be apparent to those of ordinary skill in the art without departing from the scope and spirit of the described inventive arrangements. Accordingly, reference should be made to the following claims, rather than to the foregoing disclosure, as indicating the scope of such features and implementations.

What is claimed is:

1. A method of implementing a design for a heterogeneous computing platform, comprising:
storing, using a processor, profile data in a memory, wherein the profile data is generated from running the design for the heterogeneous computing platform, wherein the design includes a kernel adapted for hardware acceleration;
determining compliance of the design with a profile rule by comparing, using the processor, the profile data accessed from the memory with the profile rule, wherein the profile rule specifies a design requirement for a hardware accelerated implementation of the kernel;
indicating, using the processor, compliance of the design with the profile rule based upon the comparing;
detecting a function in source code of the design, wherein the detected function corresponds to invoking the kernel;
selecting a guidance option associated with the profile rule from the memory based upon compliance of the design with the profile rule; and
providing the guidance option, wherein the guidance option specifies instructions for modifying the detected function in the source code of the design to improve performance of the design.

2. The method of claim 1,
wherein the detected function is adapted to exchange data between a shared memory of a host processor and the kernel.

3. The method of claim 1, wherein the guidance option comprises recommending use of an optimization pragma.

4. The method of claim 1, wherein the guidance option is presented in response to determining that the design does not implement the guidance option by inspecting the source code of the design.

5. The method of claim 1, wherein the kernel includes a plurality of compute units, the method further comprising:
determining utilization of the plurality of compute units.

6. The method of claim 1, further comprising:
determining that the detected function does not match a preferred data transfer function;
wherein the guidance option specifies using the preferred data transfer function in place of the detected function.

7. The method of claim 1, further comprising:
determining that the detected function does not use vector processing;
wherein the guidance option specifies using vector processing for the detected function.

8. The method of claim 1, further comprising:
determining that the detected function transfers an amount of data that is less than a threshold amount of data;
wherein the guidance option specifies increasing the amount of data transferred by the detected function.

9. The method of claim 1, wherein the design requirement is for kernel utilization.

10. A system for implementing a design for a heterogeneous computing platform, the system comprising:
a memory adapted to store profile data generated from running the design for the heterogeneous computing platform, wherein the design includes a kernel adapted for hardware acceleration;
a processor coupled to the memory and adapted to:
determine compliance of the design with a profile rule by comparing the profile data accessed from the memory with the profile rule, wherein the profile rule specifies a design requirement for a hardware accelerated implementation of the kernel;
indicate compliance of the design with the profile rule based upon the comparing;
detecting a function in source code of the design, wherein the detected function corresponds to invoking the kernel;
select a guidance option associated with the profile rule from the memory based upon compliance of the design with the profile rule; and
provide the guidance option, wherein the guidance option specifies instructions for modifying the detected function in the source code of the design to improve performance of the design.

11. The system of claim 10,
wherein the detected function is adapted to exchange data between a shared memory of a host processor and the kernel.

12. The system of claim 10, wherein the guidance option comprises recommending use of an optimization pragma.

13. The system of claim 10, wherein the guidance option is presented in response to determining that the design does not implement the guidance option by inspecting source code of the design.

14. The system of claim 10, wherein the kernel includes a plurality of compute units, wherein the processor is further adapted to:
determine utilization of the plurality of compute units.

15. The system of claim 10, wherein the processor is further adapted to:
determine that the detected function does not match a preferred data transfer function;
wherein the guidance option specifies using the preferred data transfer function in place of the detected function.

16. The system of claim 10, wherein the processor is further adapted to:
determine that the detected function does not use vector processing; and
wherein the guidance option specifies using vector processing for the detected function.

17. The system of claim 10, wherein the processor is further adapted to:
determine that the detected function transfers an amount of data that is less than a threshold amount of data;
wherein the guidance option specifies increasing the amount of data transferred by the detected function.

18. The system of claim 10, wherein the design requirement is for kernel utilization.

19. A computer program product comprising a computer readable storage medium having program code stored thereon, the program code executable by a processor to perform a method of implementing a design for a heterogeneous computing platform, wherein the method comprises:
storing profile data in a memory, wherein the profile data is generated from running the design for the heterogeneous computing platform, wherein the design includes a kernel adapted for hardware acceleration;
determining compliance with a profile rule by comparing the profile data accessed from the memory with the profile rule, wherein the profile rule specifies a design requirement for a hardware accelerated implementation of the kernel;
indicating compliance of the design with the profile rule based upon the comparing;

detecting a function in source code of the design, wherein the detected function corresponds to invoking the kernel;

selecting a guidance option associated with the profile rule from the memory based upon compliance of the design with the profile rule; and providing the guidance option, wherein the guidance option specifies instructions for modifying the detected function in the source code of the design to improve performance of the design.

20. The computer program product of claim 19, wherein the detected function is adapted to exchange data between a shared memory of a host processor and the kernel.

\* \* \* \* \*